United States Patent
Mourant

[19]

[11] Patent Number: 5,886,589
[45] Date of Patent: Mar. 23, 1999

[54] BALANCED TO UNBALANCED TRANSMISSION LINE TRANSFORMERS

[75] Inventor: Jean-Marc Mourant, Groton, Mass.

[73] Assignee: Analog Devices, Incorporated, Norwood, Mass.

[21] Appl. No.: 865,789

[22] Filed: May 30, 1997

[51] Int. Cl.[6] .................................................... H01P 5/10
[52] U.S. Cl. ............................................ 333/26; 333/246
[58] Field of Search ..................................... 333/26, 116

[56] References Cited

U.S. PATENT DOCUMENTS

| | | | |
|---|---|---|---|
| 4,739,289 | 4/1988 | Cripps .................................... | 333/26 |
| 5,061,910 | 10/1991 | Bouny .................................... | 333/26 |
| 5,534,830 | 7/1996 | Ralph ..................................... | 333/26 |
| 5,644,272 | 7/1997 | Dabrowski ............................. | 333/26 |
| 5,777,527 | 7/1998 | Sanders .................................. | 333/26 |

FOREIGN PATENT DOCUMENTS

59-148405   8/1984   Japan ........................................ 333/26

*Primary Examiner*—Paul Gensler
*Attorney, Agent, or Firm*—Fish & Richardson P.C.

[57] ABSTRACT

A printed circuit balanced to unbalanced (balun) transformer. The balun includes strip circuitry having first, second and third conductors. The first conductor provides a primary inductor of the transformer. The primary inductor has a first electrode adapted for coupling to an unbalanced transmission line and a second electrode electrically connected to the ground plane conductor. The second conductor provides a first secondary inductor of the transformer. The first secondary inductor is inductively coupled to a first portion of the primary inductor. A first electrode of the first secondary inductor is electrically connected to the ground plane conductor and a second electrode of the first primary inductor coupled to a first of a pair of output ports. The conductor provides a second secondary inductor of the transformer. The second secondary inductor is inductively coupled to a second portion of the primary inductor. A first electrode of the second secondary inductor is electrically connected to the ground plane conductor and a second electrode of the second secondary inductor is coupled to a second of the pair of output ports.

19 Claims, 6 Drawing Sheets

FIG. 4D ized as 5,886,589

BALANCED TO UNBALANCED TRANSMISSION LINE TRANSFORMERS

BACKGROUND OF THE INVENTION

This invention relates generally to balanced to unbalanced transformers (baluns) and more particularly to baluns adapted for printed circuit fabrication.

As is known in the art, baluns are used for coupling between a balanced transmission line and an unbalanced transmission line. For example, in unbalanced transmission lines current following a line, or trace, is delivered from a source to a load and then returns from the load to the source through a ground plane. The ground plane is a relatively wide conductor having relatively low resistance and inductance and thus can be shared between many circuits or applications.

A balanced transmission line, on the other hand, has two identical lines, or traces. The signals on the lines are 180 degrees out-of-phase with each other. The ground plane is used as a potential reference for the two out-of-phase signals. The ground plane has not disappeared, however, because it is used for shielding and for attachment to a chassis, for example. However, with a balanced transmission line the current flows out-of-phase through the two identical lines, or conductors, and not through any adjacent ground plane. In essence, the two out-of-phase signals are balanced over the ground plane because they draw the same amount of current in the exact opposite direction. This two-phase (i.e., balanced system) is used to introduce certain signal cancellations. Proper balance will cancel unwanted signals (e.g., harmonics or intermodulation products) and add desired ones. For example, in communication systems, a major contributor to system non-linearity is the front end mixer. To improve linearity, double balanced mixers are often used. These double balanced mixers cancel most non-linear products produced by the mixer. Because the transmission lines which precede and follow the double balanced mixer are typically unbalanced, baluns are typically required.

As is also known in the art, there are two general categories of baluns: active and passive. With an active balun a differential pair of transistors with sufficient common mode rejection may be used. If one input is AC grounded, the input voltage is split exactly in half and the two output currents are produced in opposite phase (i.e., 180 degrees out-of-phase with each other). A common base-common emitter configuration can also be used to provide proper phase split and, under the right conditions, good amplitude balance. However, in many applications, the noise and distortion levels associated with these active baluns limit dynamic range.

Passive baluns typically use magnetic coupling. They can be purchased and used with integrated circuit mixers as an external component. However, the cost of such a component is relatively high. While a passive balun has been integrated on a semiconductor chip using spiral inductors, losses tend to be relatively high because thin metal traces are used to form the inductors. Further, the area required on the chip to form such inductors is relatively large. One type of passive balun uses a printed circuit board as a substrate. This type of balun uses half wavelength delay lines that can provide the 180 degree phase shift. However, the resulting baluns are extremely large, even when operating at frequencies of 2 GHz.

Figure 1A:
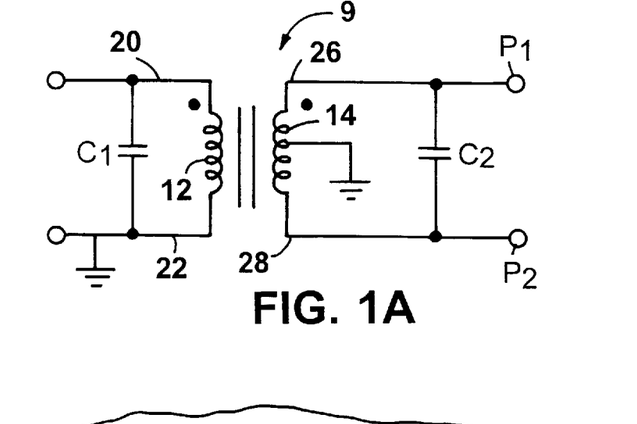
FIG. 1A is a schematic diagram of the printed circuit balun according to the prior art.

Another type of printed circuit balun 9 is shown in FIG. 1A.

SUMMARY OF THE INVENTION

In accordance with the invention, a printed circuit balanced to unbalanced (balun) transformer is provided. The balun includes a printed circuit having formed on one surface thereof a transformer. The transformer includes a pair of adjacent strip conductors. A first one of the strip conductors provides a primary inductor of the transformer and a second one of the strip conductors provides an inductively coupled secondary inductor of the transformer. The printed circuit board has formed on an opposite surface thereof a ground plane conductor. One electrode of the primary inductor is connected to the ground plane through a conductive via passing through the printed circuit board. The primary inductor is adapted for coupling to an unbalanced transmission line. Electrodes of the secondary inductor are adapted for coupling to a balanced transmission line.

The balun includes a capacitor connected to, and in resonance with, one of the inductors. One electrode of the capacitor is connected to the ground plane conductor through a conductive via passing through the printed circuit board.

In accordance with one feature of the invention, a balun is provided having a dielectric substrate with a ground plane conductor disposed on one surface of the substrate and strip conductor circuitry disposed on an opposite surface of the substrate. The strip circuitry includes a first, second and third conductors. The first conductor provides a primary inductor of the transformer. The primary inductor has a first electrode adapted for coupling to an unbalanced transmission line and a second electrode electrically connected to the ground plane conductor. The second conductor provides a first secondary inductor of the transformer. The first secondary inductor is inductively coupled to a first portion of the primary inductor. A first electrode of the first secondary inductor is electrically connected to the ground plane conductor and a second electrode of the first primary inductor is coupled to a first of a pair of output ports. The third conductor provides a second secondary inductor of the transformer. The second secondary inductor is inductively coupled to a second portion of the primary inductor. A first electrode of the second secondary inductor is electrically connected to the ground plane conductor and a second electrode of the second secondary inductor is coupled to a second of the pair of output ports.

With such an arrangement a relatively simple layout for the balun is achieved.

In one embodiment of the invention, the balun transformer including a capacitor disposed on said opposite surface of the dielectric substrate. The capacitor has a first electrode connected to the first electrode of the primary inductor and a second electrode connected to the ground plane conductor. A second capacitor is disposed on said opposite surface of the dielectric substrate. The second capacitor has a first electrode connected to the second electrode of the first secondary inductor and a second electrode connected to the second electrode of the second secondary inductor. The first capacitor and the primary inductor are arranged to form a resonant circuit tuned to the nominal operating frequency of the balun. The second capacitor and the second inductor are arranged to form a resonant circuit tuned to the nominal operating frequency of the balun.

With such an arrangement only two capacitors are required and imbalances from parasitic capacitances are eliminated.

BRIEF DESCRIPTION OF THE DRAWING

Other features of the invention, as well as the invention itself, will become more readily apparent from the following detailed description taken together with the accompanying drawings, in which.

DESCRIPTION OF THE PREFERRED EMBODIMENTS

Figure 1B:
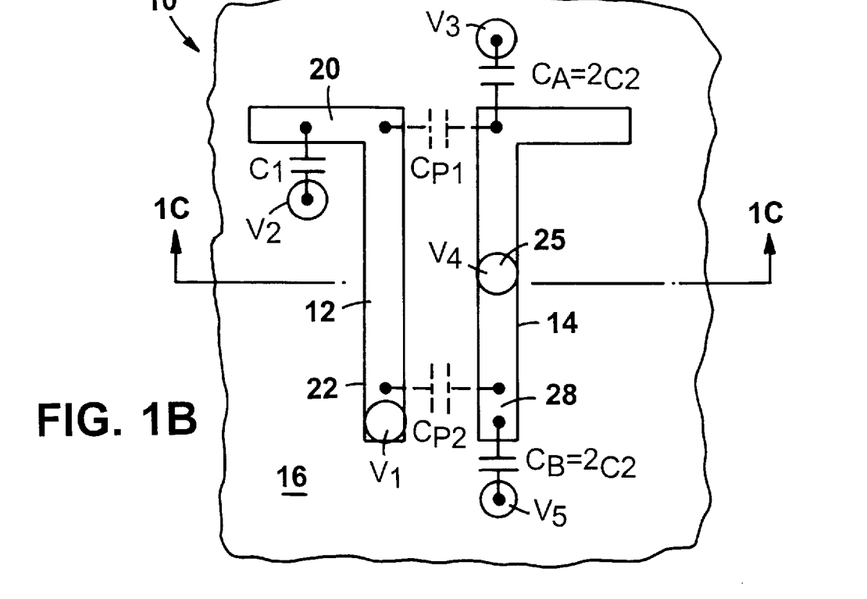
FIG. 1B is a top view layout of a printed circuit board balun according to the invention.
Figure 1C:
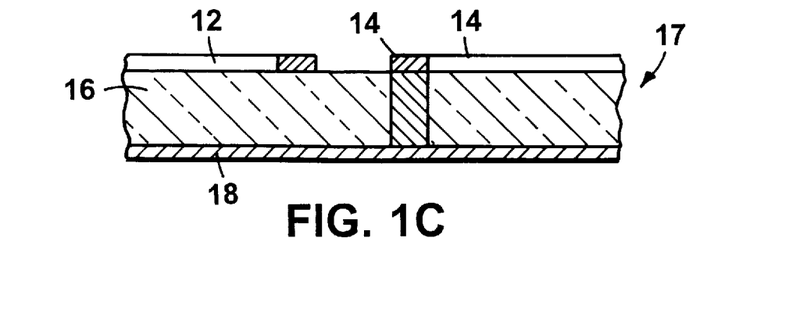
FIG. 1C is a cross-sectional view of the printed circuit board balun of FIG. 1B, such cross section being taken along line 1C—1C of FIG. 1B.

Referring now to FIG. 1B balun 10 transformer includes a pair of conductors 12, 14. Conductor 12 is a primary inductor 12 of the balun transformer 10 and conductor 14 is the secondary inductor 14 of the transformer, as indicated in FIG. 1B. The conductors 12, 14 are formed on one surface of a dielectric substrate 16 (FIG. 1C), the other surface having formed thereon a ground plane conductor 18. Thus, the strip conductor circuitry 22, the dielectric substrate 16 and the ground plane conductor 18 are a printed circuit board 17. Three capacitors, C1, CA, CB (FIG. 1B) are included, where CA=CB=2C2 and C2 is shown as the equivalent capacitor connected in parallel with the secondary inductor 14 of the transformer 10 (FIG. 1A). Thus, the primary inductor 12 is connected in parallel with the capacitor C1 to form a resonant circuit tuned to the nominal operating frequency of the balun 10. Likewise, secondary inductor 14 is connected in parallel with capacitors CA and CB to form the equivalent circuit shown in FIG. 1A, where the secondary inductor 14 and the capacitors CA, CB form a resonant circuit tuned to the nominal operating frequency of the transformer 10.

The input signal is connected to an unbalanced transmission line, not shown, and to a first electrode 20 of the primary inductor 12. The second electrode is connected to the ground plane conductor 18 through a conductive via V1 passing through the dielectric substrate 16. One electrode of capacitor C1 is connected to the first electrode 20, the second electrode of capacitor C1 is connected to the ground plane conductor 18 through a conductive via V2 passing through the dielectric substrate 16. The second conductor 14 has the mid point 25 thereof connected to the ground plane 18 through a conductive via V4 passing through the dielectric substrate 16, as shown more clearly in FIG. 1C. Thus, the secondary inductor 14 has a grounded center tap as shown in FIGS. 1A and 1B. Capacitor CA has one electrode connected to electrode 26 of the secondary inductor 14 and capacitor CA has the other electrode thereof connected to the ground plane conductor 18 through a conductive via V3 passing through the dielectric substrate 16. Likewise, Capacitor CB has one electrode connected to electrode 28 of the secondary inductor 14 and capacitor CB has the other electrode thereof connected to the ground plane conductor 18 through a conductive via V5 passing through the dielectric substrate 16. Electrodes 26, 28 at the ends of the secondary conductor 14 provide a pair of balanced output ports for the balun transformer 10.

Figure 2A:
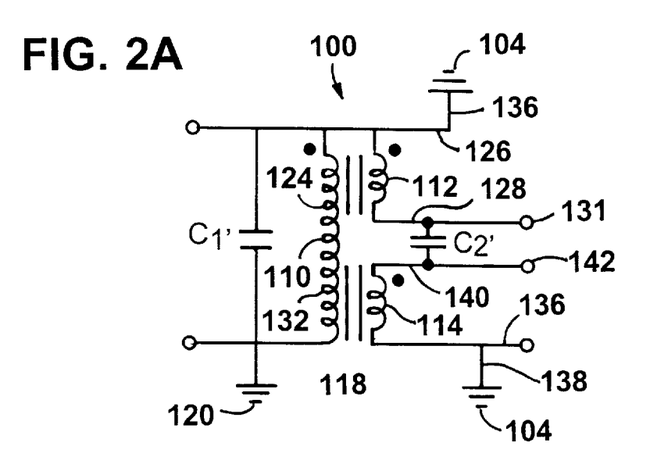
FIG. 2A is a schematic diagram of a printed circuit balun according to the invention.
Figure 2B:
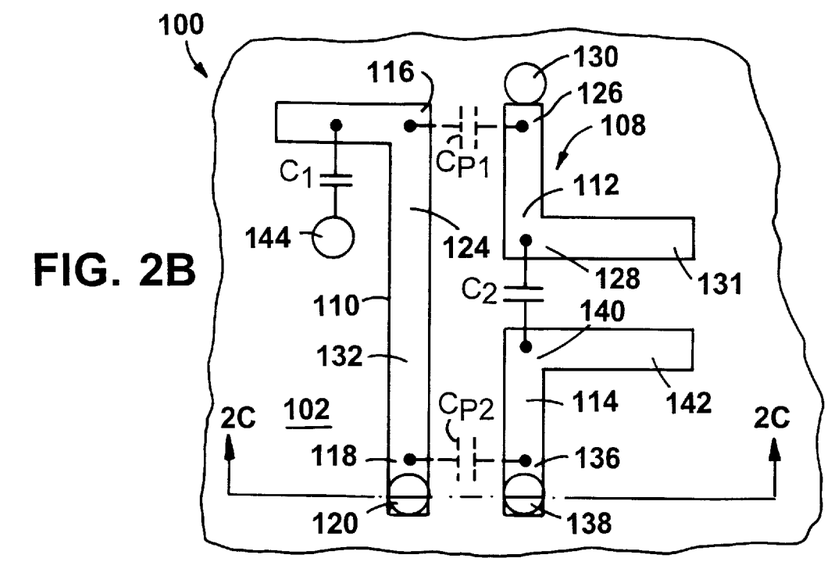
FIG. 2B is a top view layout of a printed circuit board balun according to the invention, the schematic diagram of such balun being shown in FIG. 2A.
Figure 2C:
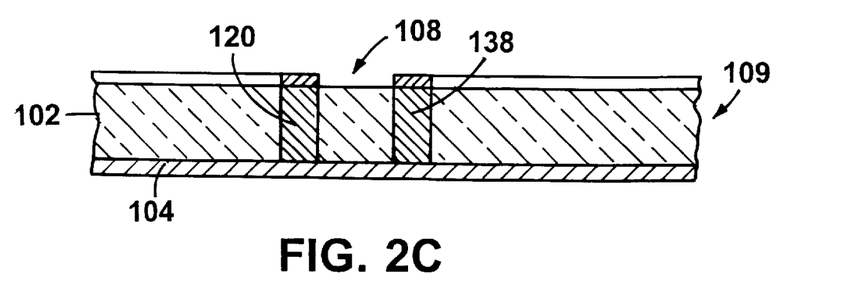
FIG. 2C is a cross-sectional view of the printed circuit board balun of FIG. 2B, such cross section being taken along line 2C—2C of FIG. 2B.

Referring now to FIGS. 2A, 2B and 2C, a printed circuit balanced to unbalanced (balun) transformer 100 is shown. The balun 100 includes a dielectric substrate 102 having a ground plane conductor 104 disposed on one surface, e.g., the bottom surface, of the dielectric substrate 102 and strip conductor circuitry 108 disposed on an opposite surface (e.g., the top surface) of the dielectric substrate 102. Here, the balun 100 is formed on a single layer printed circuit board 109 (FIG. 2C).

Figure 2D:
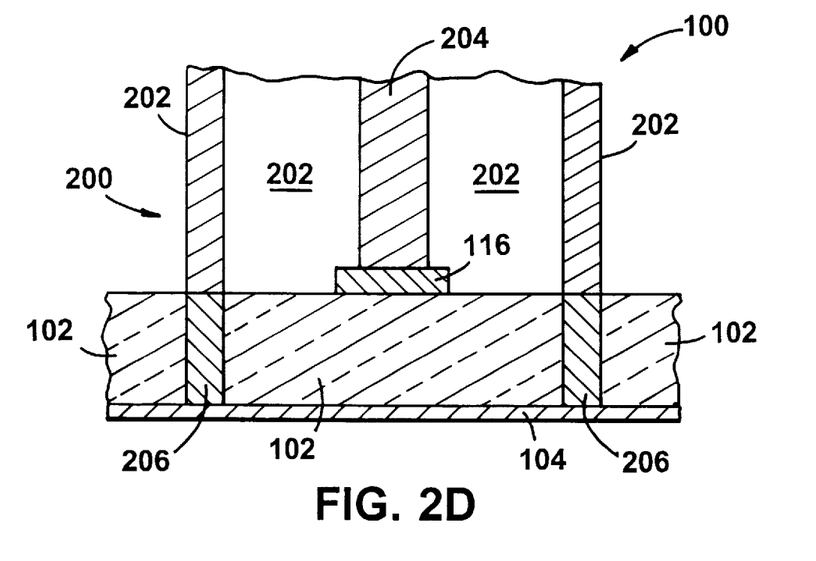
FIG. 2D is a cross-sectional view of the printed circuit board balun of FIG. 2B connected to a coaxial transmission line.

The strip circuitry 108 includes first, second and third conductors 110, 112, 114, respectively, as shown. The first conductor 110 provides a primary inductor 110 of the transformer 100. The primary inductor 110 has a first electrode 116 adapted for coupling to an unbalanced transmission line, here a coaxial transmission line 200 (FIG. 2D), and a second electrode 118 electrically connected to the ground plane conductor 104 through a conductive via 120 passing through the dielectric substrate 102 (FIG. 2C). The second conductor 112 provides a first secondary inductor 112 of the transformer 100. The first secondary inductor 112 is inductively coupled to a first portion 124 of the primary inductor 110 disposed adjacent to the first portion 124, as shown in FIG. 2B. A first electrode 126 of the first secondary inductor 112 is electrically connected to the ground plane conductor 104 through a conductive via 130 passing through the dielectric substrate 102 (FIG. 2C) and a second electrode 128 of the first secondary inductor 112 is coupled to a first output port 131.

The unbalanced transmission line, here coaxial transmission line 200, (FIG. 2D) includes an outer conductor 202 and an inner conductor 204. The inner conductor 204 is connected to the first electrode 116 of the primary inductor 124 (FIG. 2B) and the outer conductor 202 is connected to the ground plane conductor 104 by conductive vias 206 passing through the dielectric substrate 102.

The conductor 114 provides a second secondary inductor 114 of the transformer 100. The second secondary inductor 114 is inductively coupled to a second portion 132 of the primary inductor 110. A first electrode 136 of the second secondary inductor 114 is electrically connected to the ground plane conductor 104 through a conductive via 138 passing through the dielectric substrate 102 and a second electrode 140 of the second secondary inductor 114 is coupled to a second output port 142. (It is noted that conductive vias 120, 138 may be replaced with a single, common conductive via.)

The balun transformer 100 including a capacitor C1 is disposed on the opposite, i.e. top, or upper, surface of the dielectric substrate 102. The capacitor C1 has a first electrode connected to the first electrode 116 of the primary inductor 110 and a second electrode connected to the ground plane conductor 104 through a conductive via 144 passing through the dielectric substrate 102. A second capacitor C2 is disposed on said opposite (i.e., upper) surface of the dielectric substrate 102. The second capacitor C2 has a first electrode connected to the second electrode 128 of the first secondary inductor 112 and a second electrode connected to the second electrode 140 of the second secondary inductor 114.

The capacitor C1 and the primary inductor 110 provide a resonant circuit tuned to the operating frequency of balun 100, here, for example 900 MHz. Likewise, the pair of secondary inductors 112, 114 and the capacitor C2 provide a resonant circuit tuned to the operating frequency, here, for example, 900 Mhz. Here, the inductance of primary inductor 110 is 6 nano henries, the capacitance of capacitor C1 is 6 pico farads, the inductance of the first secondary inductor 112 is 3 nano henries, the inductance of the second secondary inductor is 3 nano henries, and the capacitance of capacitor C2 is 6 pico farads.

It is noted that the effect of parasitic capacitor $C'_{p1}$ (FIG. 2B) merely increases the capacitance C1 and can be absorbed into capacitor $C_1$ in providing its resonant circuit. The parasitic capacitor $C'_{p2}$ is effectively short circuited by the vias 120, 130. Thus, the parasitic capacitors $C'_{P1}$, $C'_{p2}$ do not add any imbalances in the balun 100.

Figure 3:
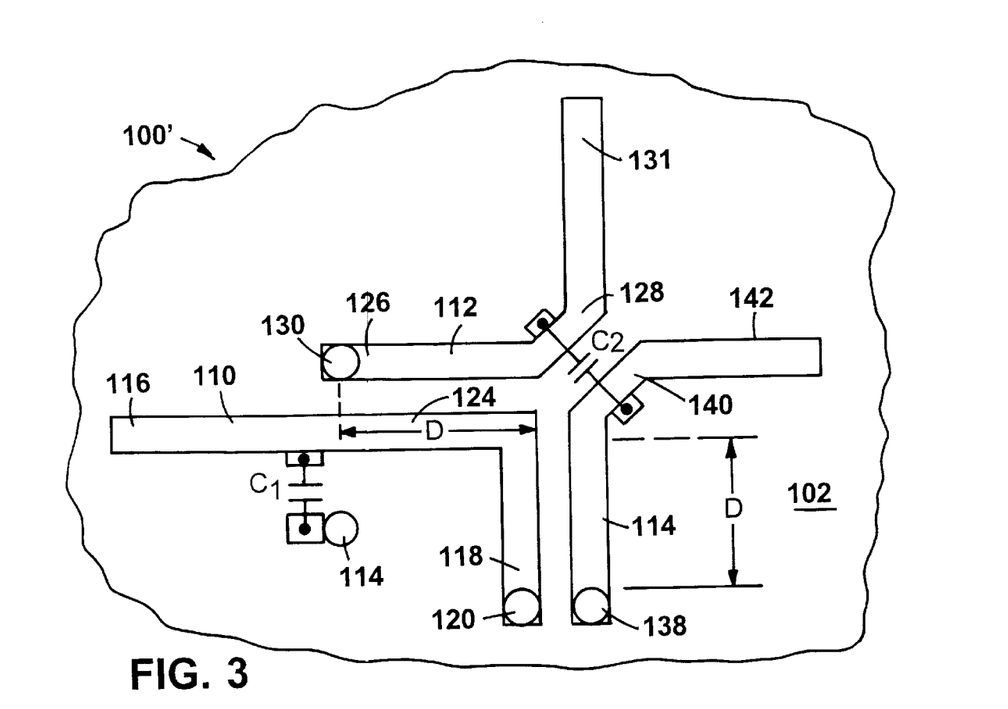
FIG. 3 is a top view of an alternative layout of a printed circuit board balun according to the invention.

Another layout for balun 100 in FIGS. 2A, 2B and 2C is shown in FIG. 3 with like elements being designated with the same numerical designation. The primary inductor 110 is formed by an elongated, here L-shaped first conductor 110. The thickness of the dielectric substrate 102, here a printed circuit board, is H. The coupling between the primary inductor 110 (i.e., conductor 110) and the secondary conductors 112, 114 is a function of the ratio of their separation, S, and the thickness, H, of the printed circuit board. In reality S can only be as small as allowed by the printed circuit board manufacturer, but H can be increased by removing all ground plane layers beneath the balun except for the last ground plane when constructing the balun from a multi-layer printed circuit board. Typical multi-layer board thickness is 62 mils. Typical minimum spacing, S, between mutually coupled primary and secondary inductors is 6 mils. A 10% ratio of S/H can be achieved which gives sufficient coupling.

Figure 4A:
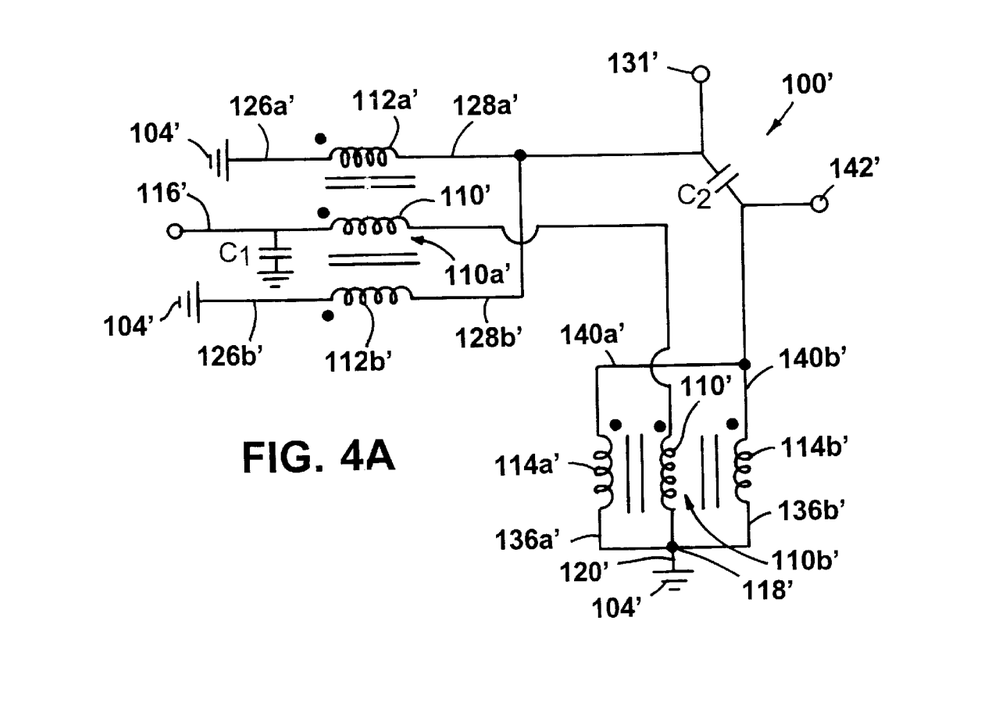
FIG. 4A is a schematic diagram of the printed circuit balun according to an alternative embodiment of the invention.
Figure 4B:
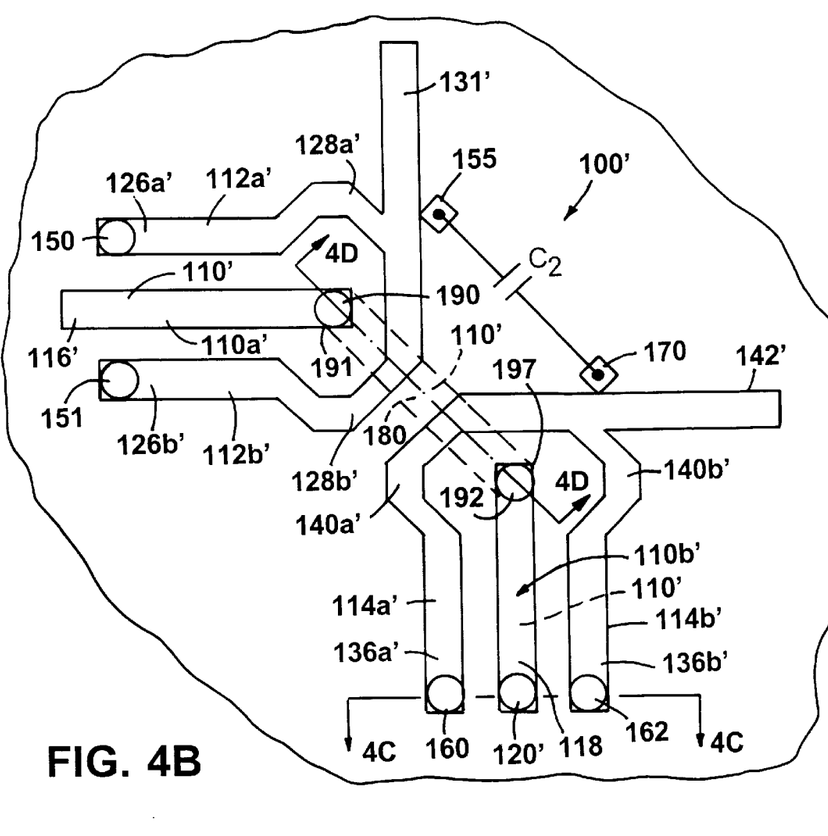
FIG. 4B is a top view layout of a printed circuit board balun according to an alternative embodiment of the invention, the schematic of the balun being shown in FIG. 4A.

Referring to FIGS. 4A–4D, an alternative balun 110' is shown adapted to operate at 1900 Mhz. Doubling the frequency from the balun 100 in FIG. 2B results in halving the inductance and halving the length of the conductor used to provide such inductor. The length of the coupling portions, D, of the primary inductor 110 (FIG. 3) for the 900 MHz balun is about 150 mils. Halving this length is difficult because of resulting parasitic, e.g., conductive vias and their end pad inductance. The schematic diagram of the balun 100' is shown in FIG. 4A. It is noted that the balun 110' has the primary inductor 110' formed in two portions, 110'a, 110'b, as shown. Inductively coupled to portion 110'a are a pair of first secondary inductors 112'a and 112'b. The secondary inductors 112'a, 112'b are disposed on opposite sides of portion 110'a. Likewise, inductively coupled to portion 110'b are a pair of second secondary inductors 114'a and 114'b. The secondary inductors 114'a, 114'b are disposed on opposite sides of portion 110'b.

Electrode 116' of the primary inductor 1101 is adapted for coupling to an input unbalanced transmission line, not shown. Electrode 118' of the primary inductor 110' is adapted for coupling to a ground plane conductor 104' through a conductive via 120' passing through both dielectric layers 102a, 102b of the multi layer printed circuit board 115'. It is noted that the layers 102a, 102b, together form the dielectric substrate for the balun.

Electrodes 126'a, 126'b of first secondary inductors 112'a, 112'b, respectively, are connected to the ground plane conductor 104' through conductive vias 150, 151 passing through the substrate formed by the dielectric layers 102a, 102b of the multi level printed circuit board 115'. Electrodes 128'a, 128'b of first secondary inductors 112'a, 112'b are connected together, to the output port 131', and to one 115 electrode of capacitor C2, as shown. Electrodes 136'a, 136'b of second secondary inductors 114'a, 114'b, respectively, are connected to the ground plane conductor 104' through conductive vias 160, 162 passing through the dielectric layers 102a, 102b of the multi level printed circuit board 115'. Electrodes 140'a, 140'b of second secondary inductors 114'a, 114'b are connected together, to the output port 142', and to the other electrode 170 of capacitor C2, as shown.

Thus, balun 100' (FIGS. 4A–4D) includes an additional first secondary inductor 112'a connected in parallel with the first secondary inductor 112'b. The first secondary inductors 112'a, 112'b are both inductively coupled to the first portion 110'a of the primary inductor 110'. The balun 100' includes an additional second secondary inductor 114'a connected in parallel with the second secondary inductor 114'b. The second secondary inductors 114'a, 114'b are both inductively coupled to the second portion 110'b of the primary inductor 110'.

Thus, the balun in FIGS. 4A–4D uses three coupled lines increasing the coupling (thus bandwidth) and reducing secondary inductance (i.e., the two conductors and their inductance are in parallel). It may appear, at first, that the inductance of the primary conductor does not appear to be reduced; however, due to strong mutual coupling, the reduction in the secondary is equivalent to the reduction in the primary.

Figure 4C:
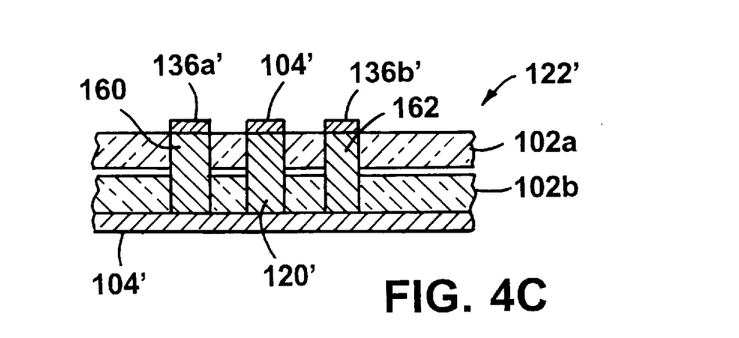
FIG. 4C is a cross-sectional view of the printed circuit board balun of FIG. 4B, such cross section being taken along line 4C—4C of FIG. 4B.
Figure 4D:
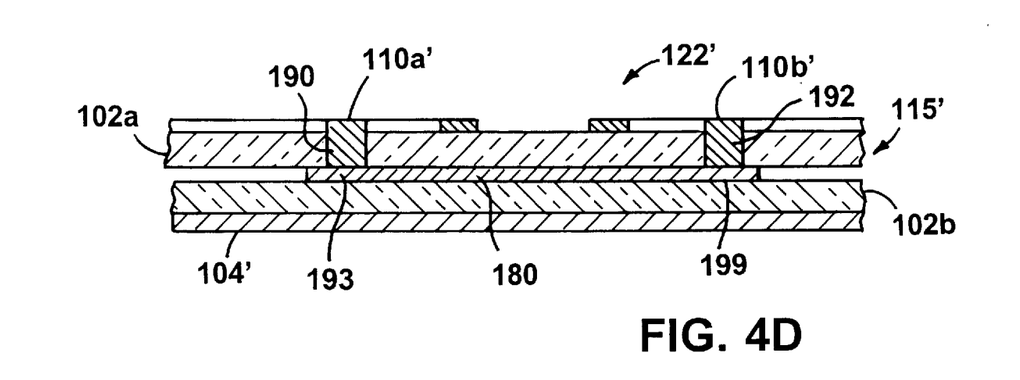
FIG. 4D is a cross-sectional view of the printed circuit board balun of FIG. 4B, such cross section being taken along line 4D—4D of FIG. 4B.

As shown in FIGS. 4C and 4D, the printed circuit board 115' includes two dielectric layers 102a, 102b. The upper surface of layer 102a has the printed strip conductor circuitry 122 formed thereon. The bottom surface of layer 102b layer has the ground plane conductor 104' formed thereon. A strip conductor section 180 is formed on either the bottom of layer 102a or the top of layer 102b. A pair of conductive vias 190, 192 pass through layer 102a (FIG. 4D) to electrically interconnect portions 110'a and 110'b of the primary inductor 110'. Thus, conductive via 190 electrically connects distal end 191 of the portion 110'a of primary inductor 110' to an underling end 193 of the strip conductor section 180. Likewise, conductive via 192 electrically connects distal end 197 of the portion 110'a of primary inductor 110' to an underling end 199 of the strip conductor section 180. Thus, the conductive strip 180 acts as an underpass to electrically interconnect the first and second portions 110'a, 110'b of the primary inductor 110', as shown.

Other embodiments are within the spirit and scope of the invention.

What is claimed is:
1. A balanced to unbalanced transformer comprising:
(A) a dielectric substrate;
(B) a ground plane conductor disposed on one surface of the substrate;
(C) strip conductor circuitry disposed on an opposite surface of the substrate, such circuitry comprising:
(a) a first conductor providing a primary inductor of the transformer, such primary inductor having a first electrode adapted for coupling to an unbalanced transmission line and a second electrode electrically connected to the ground plane conductor;
(b) a second conductor providing a first secondary inductor of the transformer, such first secondary inductor bring inductively coupled to a first portion of the primary inductor, a first electrode of the first secondary inductor being electrically connected to the ground plane conductor and a second electrode of the first primary inductor being coupled to a first of a pair of output ports; (c) a third conductor providing a second secondary inductor of the transformer, such second secondary inductor being inductively coupled to a second portion of the primary inductor, a first electrode of the second secondary inductor being electrically connected to the ground plane conductor and a second electrode of the second secondary inductor being coupled to a second of the pair of output ports; and
a capacitor disposed on said opposite surface of the dielectric substrate, such capacitor having a first electrode connected to the first electrode of the primary inductor and a second electrode connected to the ground plane conductor.

2. The transformer recited in claim 1 including an additional capacitor disposed on said opposite surface of the dielectric substrate, such additional capacitor having a first electrode connected to the second electrode of the first secondary inductor and a second electrode connected to the second electrode of the second secondary inductor.

3. The transformer recited in claim 2 wherein the pair of secondary inductors and the additional capacitor provide a resonant circuit.

4. The transformer recited in claim 3 including an additional first secondary inductor connected in parallel with the first mentioned first secondary inductor, such additional first secondary inductor being inductively coupled to the first portion of the primary inductor.

5. The transformer recited in claim 4 including an additional second secondary inductor connected in parallel with the first mentioned second secondary inductor, such additional second secondary inductor being inductively coupled to the second portion of the primary inductor.

6. The transformer recited in claim 1 wherein the capacitor and the primary inductor provide a resonant circuit.

7. A balanced to unbalanced transformer comprising:
(A) a dielectric substrate;
(B) a ground plane conductor disposed on one surface of the substrate;
(C) strip conductor circuitry disposed on an opposite surface of the substrate, such circuitry comprising:
(a) a first conductor providing a primary inductor of the transformer, such primary inductor having a first electrode adapted for coupling to an unbalanced transmission line and a second electrode electrically connected to the ground plane conductor;
(b) a second conductor providing a first secondary inductor of the transformer, such first secondary inductor being inductively coupled to a first portion of the primary inductor, a first electrode of the first secondary inductor being electrically connected to the around plane conductor and a second electrode of the first primary inductor being coupled to a first of a pair of output ports; (c) a third conductor providing a second secondary inductor of the transformer, such second secondary inductor being inductively coupled to a second portion of the primary inductor,
a first electrode of the second secondary inductor being electrically connected to the ground plane conductor and a second electrode of the second secondary inductor being coupled to a second of the pair of output ports; and
a capacitor disposed on said opposite surface of the dielectric substrate, such capacitor having a first electrode connected to the second electrode of the first secondary inductor and a second electrode connected to the second electrode of the second secondary inductor.

8. The transformer recited in claim 7 wherein the pair of secondary inductors and the capacitor provide a resonant circuit.

9. A balanced to unbalanced transformer comprising:
(A) a dielectric substrate;
(B) a ground plane conductor disposed on one surface of the substrate;
(C) strip conductor circuitry disposed on an opposite surface of the substrate, such circuitry comprising
(a) a primary of the transformer, such comprising:
(i) an elongated first conductor having: a first end adapted for coupling to an unbalanced transmission line; and, a second end electrically connected to the ground plane conductor through the dielectric substrate;
(b) a pair of secondaries of the transformer, comprising:
(i) a second conductor disposed adjacent and inductively coupled to a first portion of the first conductor, such first portion being between the first end and a region between the first and second ends of the first conductor, a first end of the second conductor being electrically connected to the ground plane conductor through the dielectric substrate, a second end of the second conductor providing a first of a pair of output ports, such second conductor providing one of the pair of secondaries;
(ii) a third conductor disposed adjacent and inductively coupled to a second portion of the first conductor serially connected to the first portion of the first conductor, such second portion being between the second end the first conductor and the region between the first and second ends of the first conductor, a first end of the third conductor being electrically connected to the ground plane conductor through the dielectric substrate, a second end of the third conductor providing a second of the pair of output ports, such third conductor providing the other one of the pair of secondaries.

10. The transformer recited in claim 9 including a capacitor disposed on said opposite surface of the dielectric substrate, such capacitor having a first electrode connected to the first end of the first conductor and a second electrode connected to the ground plane conductor through the dielectric substrate.

11. The transformer recited in claim 10 including a capacitor disposed on said opposite surface of the dielectric substrate, such capacitor having a first electrode connected proximate the second end of the second conductor and a second electrode connected proximate to the second end of the third conductor.

12. The transformer recited in claim 10 including an additional capacitor disposed on said opposite surface of the dielectric substrate, such additional capacitor having a first electrode connected proximate to the second end of the second conductor and a second electrode connected proximate to the second end of the third conductor.

13. The transformer recited in claim 10 wherein the capacitor and the first conductor provides an inductor and wherein the capacitor and the inductor provide a resonant circuit.

14. The transformer recited in claim 11 wherein the second and third conductors provide a pair of parallel connected inductors and where such inductors and the capacitor provide a resonant circuit.

15. The transformer recited in claim 12 wherein the second and third conductors provide a pair of parallel connected inductors and wherein such inductors and the additional capacitor provide a resonant circuit.

16. The transformer recited in claim 9 wherein a first one of the pair of secondaries includes an additional conductor connected in parallel with the second conductor, such additional conductor being disposed adjacent and inductively coupled to the first portion of the first conductor.

17. The transformer recited in claim 16 wherein a second one of the pair of secondaries includes a second additional conductor connected in parallel with the second conductor, such second additional conductor being disposed adjacent and inductively coupled to the second portion of the first conductor.

18. The transformer recited in claim 16 wherein the additional conductor and the second conductor are disposed along opposite sides of the first portion of the first conductor and wherein the second additional conductor and the third conductor are disposed along opposite sides of the second portion of the first conductor.

19. The transformer recited in claim 18 wherein the region of the first conductor is disposed between the opposite surfaces of the dielectric substrate.

* * * * *